United States Patent [19]

Bayer

[11] Patent Number: 5,548,240

[45] Date of Patent: Aug. 20, 1996

[54] CIRCUIT ARRANGEMENT FOR DRIVING A MOS FIELD-EFFECT TRANSISTOR

[76] Inventor: Erich Bayer, Am Blankenfeld 15, 84030 Piflas, Germany

[21] Appl. No.: 397,013

[22] Filed: Mar. 1, 1995

Related U.S. Application Data

[63] Continuation of Ser. No. 146,858, Nov. 3, 1993, abandoned.

[30] Foreign Application Priority Data

Nov. 3, 1992 [DE] Germany ............................ 4237125.2

[51] Int. Cl.⁶ .............................. H03K 3/01; H03K 5/12
[52] U.S. Cl. .......................... 327/432; 327/427; 327/374; 327/377; 327/387; 327/170; 327/108; 327/379; 326/27
[58] Field of Search ...................... 307/521, 246, 307/572, 574, 575, 577, 542, 263, 443; 327/365, 374, 384, 376, 377, 432, 108, 170, 434, 427, 387, 379; 326/17, 27, 21, 26

[56] References Cited

U.S. PATENT DOCUMENTS

| | | | |
|---|---|---|---|
| 4,461,966 | 7/1984 | Hebenstreit | 302/571 |
| 4,481,434 | 11/1984 | Jamutka | 307/572 |
| 5,204,562 | 4/1993 | Pace | 327/432 |
| 5,264,736 | 11/1993 | Jacobson | 302/522 |
| 5,289,051 | 2/1994 | Zitta | 302/263 |
| 5,321,313 | 6/1994 | Oberhauser | 327/432 |

FOREIGN PATENT DOCUMENTS

| | | |
|---|---|---|
| A-0327160 | 9/1989 | European Pat. Off. . |
| 0035616 | 2/1986 | Japan ........................ 307/521 |

OTHER PUBLICATIONS

"Controlled Transition, Short Circuit Current Regulated Off–Chip Driver", *IBM Technical Disclosure Bulletin*, vol. 28, No. 12, May 1986, pp. 5439–5440.

Brian E. Taylor, "Leistungs–Mosfet–Module fur hohe Strome", *Elektronik*, vol. 35, No. 11 May 30, 1986, pp. 123–124.

*Primary Examiner*—Timothy P. Callahan
*Assistant Examiner*—Dinh T. Le
*Attorney, Agent, or Firm*—Dana L. Burton; James C. Kesterson; Richard L. Donaldson

[57] ABSTRACT

A circuit arrangement for gate-controlling a MOS field-effect transistor ($T_o$) comprises a discharge circuit (12) via which the charge stored in the gate-source capacitance ($C_{GS}$) can be discharged according to a time constant, the value of which depends on the internal impedance of said discharge circuit (12). This discharge circuit (12) can be switched between two conditions determined by a relatively large and a relatively small internal impedance respectively and assumes the condition dictated by the relatively small internal impedance as soon as the gate-source voltage ($U_{GS}$) has dropped below a predetermined limit.

13 Claims, 3 Drawing Sheets

CIRCUIT ARRANGEMENT FOR DRIVING A MOS FIELD-EFFECT TRANSISTOR

This application is a Continuation, of application Ser. No. 08/146,858, filed Nov. 3, 1993 and now abandoned.

FIELD OF THE INVENTION

The invention relates to a circuit arrangement for driving a metal-oxide semiconductor (MOS) field-effect transistor, particularly a power MOS field-effect transistor.

BACKGROUND OF THE INVENTION

It is often the case in power output stages that care must be taken to ensure that the corresponding power MOS field-effect transistors are not switched on/off too quickly, so as to keep to the prescribed maximum values of the slew rates of the output voltage or output current.

As a rule, for the correspondingly slow switch-off a discharge circuit is provided switchable between the gate electrode and the source electrode of the MOS field-effect transistor in each case. The gate-source capacitance of the MOS field-effect transistor is thus discharged according to a time constant, the value of which depends on the capacitance and on the internal impedance of the discharge circuit.

The desired fall time of the gate voltage is usually established by an ohmic resistance circuited in series with the gate-source capacitance or by a current impressed on the discharge circuit.

Although such a means of controlling the MOS field-effect transistor allows the slew rate of the output voltage or of the output current to be limited to a predetermined value, whereby the internal impedance of the discharge circuit is to be selected all the more higher, the lower the required fall rate, this has the disadvantage that the gate electrode of the MOS field-effect transistor is loaded with the relatively large internal impedance of the discharge circuit which in the case of noise being coupled into the circuit, particularly via the reverse capacitance, may result in an uncontrolled return ON of the already switched-off MOS field-effect transistor.

SUMMARY OF THE INVENTION

The object of the invention is to provide a particularly easy to realize circuit arrangement of the aforementioned kind which not only ensures a controlled switch-off of the MOS field-effect transistor by discharging the gate-source capacitance correspondingly slowly but which at the same time is also insensitive to accumulating (noise) voltages.

This object is achieved according to the invention by the discharge circuit being switchable between two conditions as determined by a relatively large and a relatively small internal impedance, respectively. The condition determined by the relatively small internal impedance is impedance as soon as the gate-source voltage drops below a predetermined limit value. Preferably, the internal impedance of the discharge circuit has a value in the region of zero when the gate-source voltage is below the predetermined limit value.

As a result of this embodiment, an extremely reliable gate control circuit is achieved by simple means which is practically insensitive to accumulating (noise) voltages coupled into the circuit and which, nevertheless, permits a controlled switch-off of the MOS field-effect transistor, whereby the time required for discharging the gate-source capacitance and thus the fall time of the gate voltage is extended. By these means, any predetermined upper limit values can be maintained without problem for the slew rate of the output signals of the MOS field-effect transistor without having to take into account an increased sensitivity with respect to accumulating (noise) voltages.

The switch-off action is divided into two subsequent time periods, of which the first, during which the gate-source voltage is still higher than the predetermined limit value, is characterized by the relatively large internal impedance of the discharge circuit and the second period establishes the relatively small internal impedance as soon as the gate-source voltage has dropped below the predetermined limit value.

While the relatively large internal impedance dictating the first period ensures a relatively slow discharge of the gate-source capacitance the resulting, relatively small internal impedance subsequently ensures that the accumulating (noise) voltages coupled into the circuit, particularly via the reverse capacitance, at the gate electrode remain sufficiently small to maintain the MOS field-effect transistor in the switched-off condition. When the internal impedance of the discharge circuit at a gate-source voltage less than the pretermined limit value assumes a value in the region of zero, any accumulated voltages resulting at the gate electrode are reduced to a minimum.

The predetermined limit value of the gate-source voltage is preferably selected so that the drain current corresponding to this limit value is already so small as to be negligable or assumes a value in the region of zero, thus making it impossible for any remaining accumulated voltage spikes detrimental to the transistor to result due to a remaining fast discharge of the gate-source capacitance at the output of the MOS field-effect transistor, caused, for instance, by an inductive load or by the line inductance normally existing.

A particularly simple and correspondingly reliable circuit configuration is achieved by the discharge circuit being preferably formed by two current paths circuited in parallel, one of which exhibits the relatively high impedance value and by means of the other, the current path exhibiting the relatively small impedance value can be bypassed as soon as the gate-source voltage has exceeded the assignable clamp value. Accordingly the relatively high impedance dictating slow discharge of the gate-source capacitance is practically short-circuited with the relatively small internal impedance, preferably located in the region of zero, as soon as the predetermined voltage limit value is fallen short of.

In accordance with one practical embodiment of the circuit arrangement the gate electrode of the MOS field-effect transistor can be additionally assigned a charging circuit comprising a charging resistor by means of which the time constant dictating charging of the gate-source capacitance is established. Assigning the charging circuit and the discharge circuit is usefully done alternatively so that the gate electrode of the MOS field-effect transistor is always assigned only one of these two circuits.

The subclaims cite further advantegous embodiments of the circuit arrangement according to the invention.

The invention will now be described in more detail on the basis of an example embodiment of the circuit arrangement according to the invention with reference to the drawing in which:

BRIEF DESCRIPTION OF THE DRAWINGS

FIG. 4 shows in section B the time profile of the internal impedance of the discharge circuit of the circuit arrangement according to the invention as shown in FIG. 3.

DETAILED DESCRIPTION OF THE DRAWINGS

Figure 1:
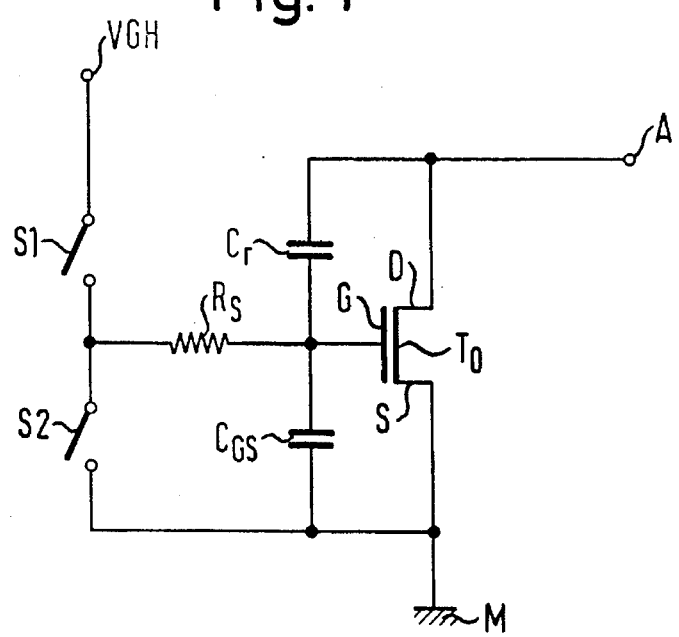
FIG. 1 shows a conventional circuit arrangement for gate-controlling a metal-oxide semiconductor field-effect transistor via an ohmic resistance.

FIG. 1 shows a conventional circuit arrangement for gate-controlling a metal-oxide semiconductor (MOS) field-effect transistor $T_o$ comprising a resistor $R_s$ circuited in series with the gate electrode G of the MOS field-effect transistor $T_o$, this resistor being connectable via a switch S1 to a supply voltage VGH and via switch S2 to ground (M). The drain electrode D of the MOS field-effect transistor $T_o$ is connected to an output terminal A. The source electrode S is grounded (M).

If the MOS field-effect transistor $T_o$ is to be switched on, switch S1 is closed, while switch S2 remains open. Accordingly, the gate-source capacitance $C_{GS}$ is charged via the resistor $R_s$ until the gate voltage is substantially the same as the supply voltage VGH.

If the MOS field-effect transistor $T_o$ is to be switched off, switch S1 is opened, while switch S2 is closed. Accordingly, the gate-source capacitance $C_{GS}$ is discharged via the resistor $R_s$.

By selecting a correspondingly high value of the resistor $R_s$ circuited in series with the gate-source capacitance CGS, relatively high values for the time constants dictating the switch-on/off action can be achieved, i.e. in comparison with a gate electrode G connected directly to the supply voltage VGH or ground M, so that the slew rate in the output signals of the MOS field-effect transistor $T_o$ remains within limits. This known circuit arrangement has the disadvantage, however, that the gate electrode G is loaded by the relatively high internal impedance $R_s$ of the control circuit particularly when the MOS field-effect transistor is already OFF. Noise signals (accumulated voltages) coupled into the circuit, for instance, via the reverse capacitance $C_r$ may thus result in the gate voltage being raised to such an extent that the MOS field-effect transistor $T_o$ is switched on undesirably.

Such an uncontrolled switching on action of the MOS field-effect transistor $T_o$ may result in actual practice as soon as noise pulses (spikes) occur amounting to four to ten times the threshold voltage of the MOS field-effect transistor $T_o$, this resulting from the fact that the reverse capacitance $C_r$ in actual practice, and depending on the transistor concerned, has a value in the region of ¼ to 1/10 of $C_{GS}$, for example.

Figure 2:
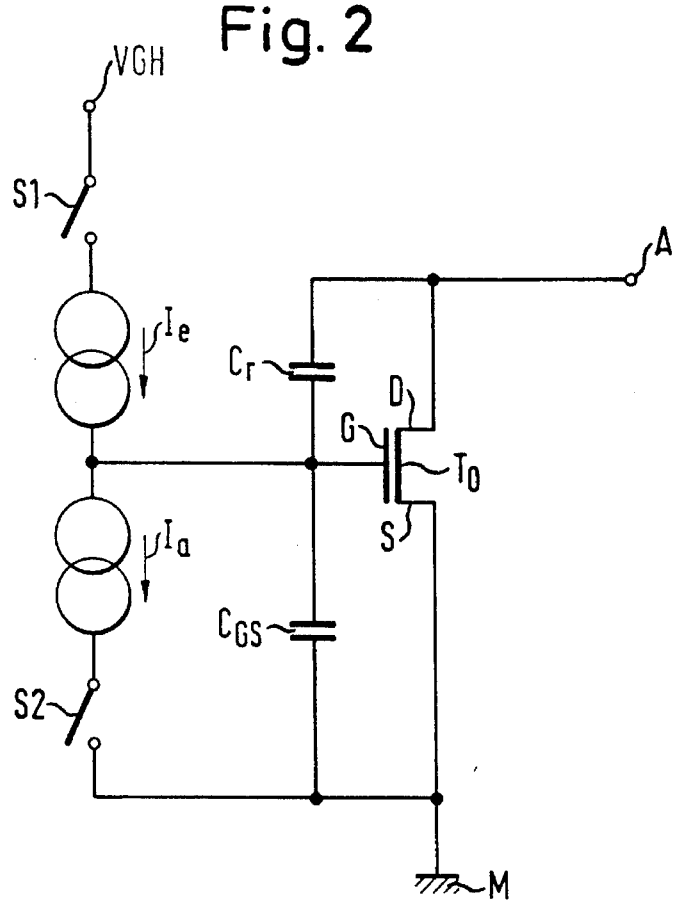
FIG. 2 shows a conventional circuit arrangement for gate-controlling a metal-oxide semiconductor field-effect transistor via an impressed current.

FIG. 2 shows a further conventional circuit arrangement for gate-controlling a MOS field-effect transistor $T_o$ which differs from that shown in FIG. 1 merely by the ohmic resistor $R_s$ being replaced by two sources of constant current to impress a current $I_e$ and $I_a$ respectively during ON/OFF action.

In this case too, a relatively high internal impedance of the control circuit is caused by means of which the gate electrode of the MOS field-effect transistor $T_o$ itself is loaded even when the transistor is OFF. Particularly noise coupled into the circuit via the reverse capacitance $C_r$ can thus result in the gate voltage increasing to such an extent that the MOS field-effect transistor $T_o$ is again unwantedly switched on.

Figure 3:
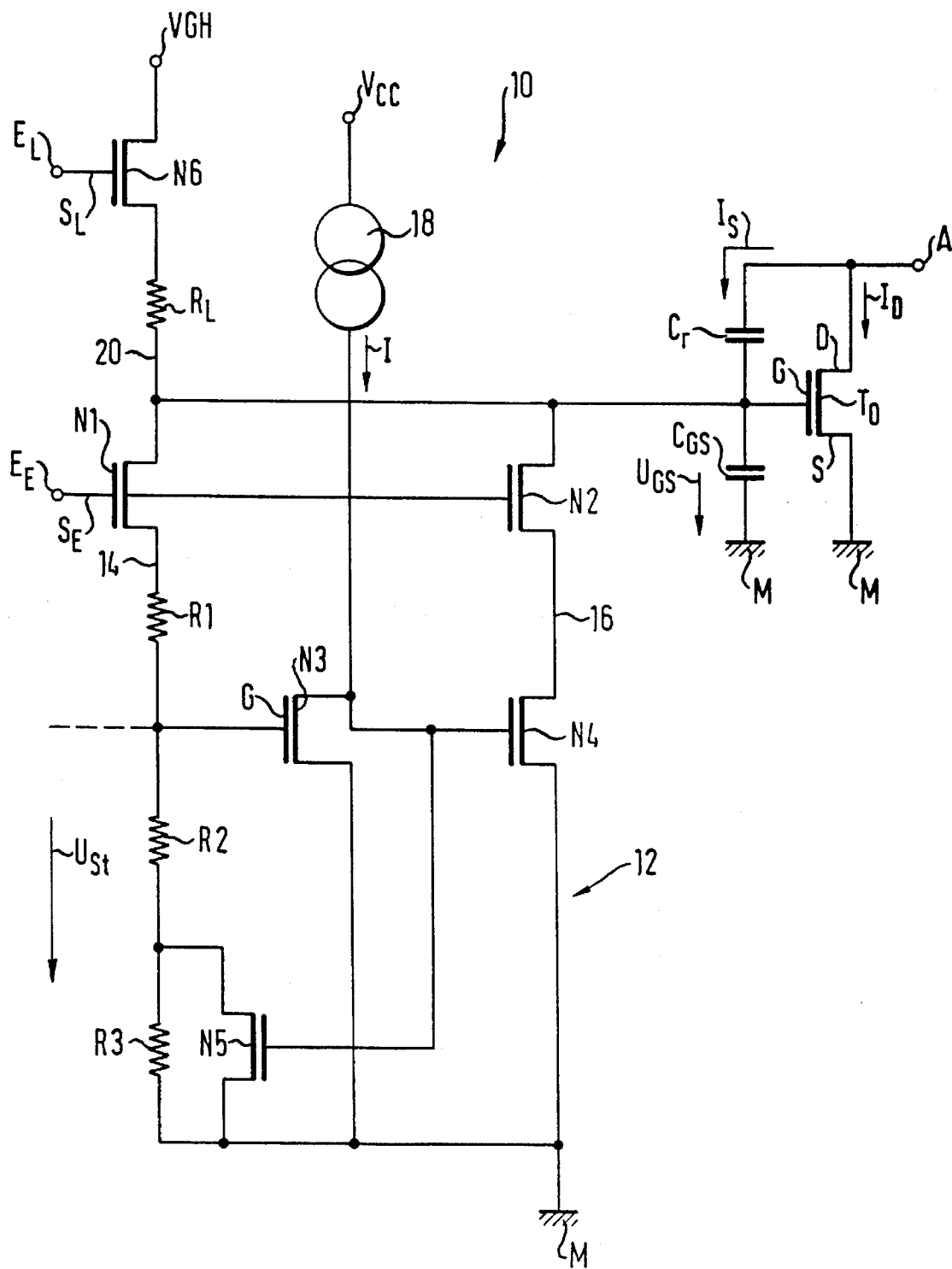
FIG. 3 shows the circuit principle of a circuit arrangement for gate-controlling a metal-oxide semiconductor field-effect transistor according to the invention.

FIG. 3 shows the principle of one embodiment of a circuit arrangement 10 according to the invention which, in turn, is designed for gate-control of a metal-oxide semiconductor (MOS) field-effect transistor $T_o$ which in particular may be a power MOS field-effect transistor of a power output stage.

Here, the drain electrode D of the MOS field-effect transistor $T_o$ is again connected to an output terminal A. The source connection S of this MOS field-effect transistor $T_o$ is, in turn, connected to ground M. Between the gate electrode G and the source electrode S the gate-source capacitance $C_{GS}$ is applied, while between the drain electrode D and the gate electrode G the reverse capacitance $C_r$ is applied. Due to the reverse capacitance $C_r$ noise currents $I_s$ must be reckoned with between the drain and gate electrodes D and G, respectively, of the MOS field-effect transistor $T_o$.

The circuit arrangement 10 comprises a discharge circuit 12 switchable between the gate electrode G and the source electrode S of the MOS field-effect transistor $T_o$ via two electronic switches. Via the discharge circuit 12 the charge stored in the gate-source capacitance $C_{GS}$ can be discharged during switch-off action of the transistor $T_o$ according to a time constant t, the value of which depends on the internal impedance $Z_1$ of the discharge circuit 12.

The discharge circuit 12 comprises two current paths 14, 16 circuited in parallel, in which one each of the two electronic switches N1 and N2 respectively controlled in common is arranged. It is, however, also generally feasible to activate these two parallel current paths 14, 16 of the gate electrode G of the MOS field-effect transistor $T_o$ via a single, common switch.

The current path 14 further contains a voltage divider of three resistors in series R1, R2 and R3 which, on one end, can be connected via the series arrangement of the electronic switch N1 to the gate electrode G of the MOS field-effect transistor $T_o$ and, on the other, is grounded at M. When the electronic switch N1 is closed this current path 14 of the discharge circuit 12 has a relatively high internal impedance $Z_1$ which is substantially determined by the three ohmic resistors R1, R2 and R3.

The current path 16 of the discharge circuit 12, which is switchable to the gate electrode G of the MOS field-effect transistor $T_o$ via the electronic switch N2, comprises a further electronic switch N4 which is circuited in series with the electronic switch N2. When the electronic switches N2 and N4 are closed, this current path 16 of the discharge circuit 12 has a relatively small internal impedance which may be practically in the region of zero.

The electronic switch N4 of the current path 16 which, on one end, is grounded at M and, on the other, is connected via the electronic switch N2 to the gate electrode G of the MOS field-effect transistor $T_o$, is controllable via a switching transistor N3, the gate of which $N3_G$ receives a control voltage $U_{St}$ which is tapped at the junction between the two resistors R1 and R2 of the voltage divider R1–R3 and which is determined by the drop in voltage across the two resistors R2, R3. In the example embodiment, the switching transistor N3 is formed by a field-effect transistor, the source electrode of which is grounded at M and the gate electrode of which G is connected to the junction between the two resistors R1 and R2.

The drain electrode of the switching transistor N3 forming the control output for controlling the electronic switch N4 is connected to a constant current source 18 which receives the supply voltage $V_{CC}$ and furnishes an impressed current I.

Via the control output or the drain electrode of the switching transistor N3 a further electronic switch N5 is controllable, via which the resistor R3 can be bypassed when the switching transistor N3 is OFF. The two electronic switches N4, N5 are thus controlled by the switching transistor N3 in such a way that they are open when the switching transistor N3 is ON and closed when the switching transistor N3 is OFF.

In the example embodiment shown, all electronic switches N1–N5 are each formed by a field-effect transistor, whereby the two gate electrodes of the electronic switches N4, N5 are connected to the drain electrode of the switching transistor N3 and the two gate electrodes of the electronic switches N1, N2 can be controlled in common via a control discharge signal $S_E$. This control discharge signal $S_E$ can be applied to an input $E_E$ which is connected to the gate electrodes of the two electronic switches N1, N2 and through which a discharge of the gate-source capacitance $C_{GS}$ and thus the corresponding reduction in the gate-source voltage $U_{GS}$ of the MOS field-effect transistor $T_o$ can be activated.

Figure 4:
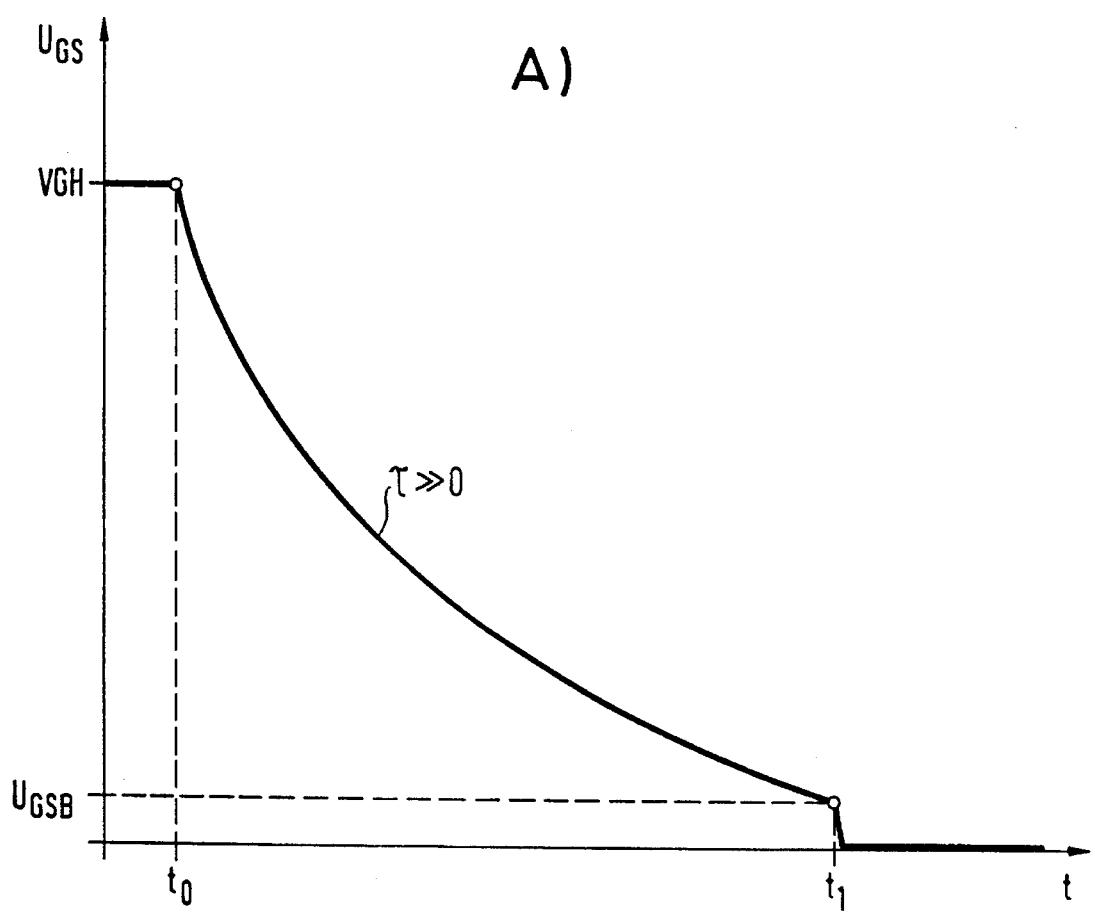
FIG. 4 shows in section A the time profile of the gate-source voltage of the metal-oxide semiconductor field-effect transistor gate-controlled by the circuit arrangement according to the invention as shown in FIG. 3, during the switch-off action.
Figure 4:
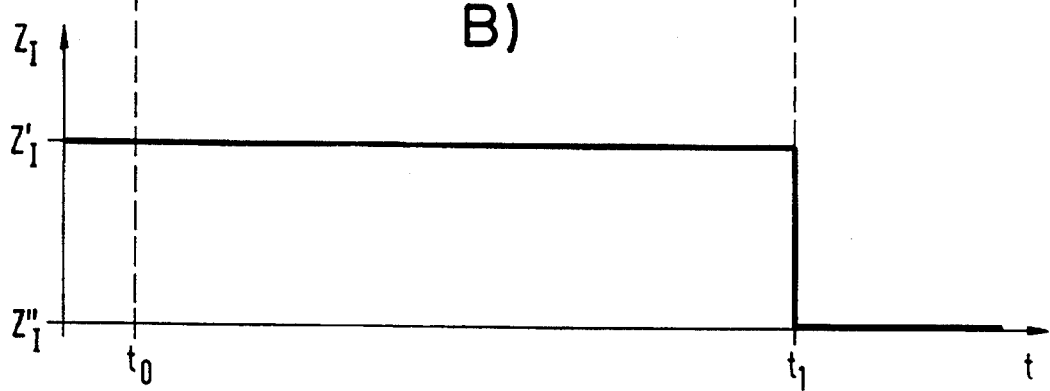

The voltage divider comprising the three ohmic resistors R1, R2 and R3 of the current path 14 is dimensioned so that switching transistor N3 is OFF when the discharge circuit 12 is active via the discharge signal $S_E$, thus closing the electronic switch N4 of the current path 16 as soon as the gate-source voltage $U_{GS}$ applied to the discharge circuit 12 has fallen below an assignable clamp value $U_{GSB}$ (viz. FIG. 4). This clamp value is usefully selected so that the corresponding drain current $I_D$ of the MOS field-effect transistor $T_o$ has such a small value as to be negligable which can preferably be in the region of zero.

For switching on the MOS field-effect transistor $T_o$, a charging circuit 20 is provided which comprises an electronic switch N6 in series with a charging resistor $R_L$ via which the gate-source capacitance $C_{GS}$ of the MOS field-effect transistor $T_o$ can be charged up to a voltage $V_{GH}$ to which the charging resistor $R_t$ can be applied via the electronic switch N6.

The gate electrode of the electronic switch N6 which is in turn formed by a field-effect transistor is connected to an input $E_L$ to which the control charge signal $S_L$ can be applied as soon as the MOS field-effect transistor $T_o$ is to be switched on and, accordingly, its gate-source capacitance $C_{GS}$ is to be charged.

FIG. 4A shows the switch-off action time profile of the gate-source voltage $U_{GS}$ of the MOS field-effect transistor $T_o$ controlled by the circuit arrangement 10 according to the invention as shown in FIG. 3. By comparison, FIG. 4B illustrates the resulting time profile of the internal impedance $Z_1$ of the discharge circuit 12 of the circuit arrangement 10 according to the invention as shown in FIG. 3. during the switch-off action.

The function of the circuit arrangement according to the invention is as follows:

To switch on the MOS field-effect transistor $T_0$ it is necessary that the input $E_L$ receives a control charge signal $S_L$ which closes the electronic switch N6. The electronic switches N1, N2 remain open due to the absence of a control discharge signal at the other input $E_E$. Accordingly, the gate electrode G of the MOS field-effect transistor $T_o$ merely receives the charging circuit 20 so that the gate-source capacitance $C_{GS}$ is charged via the charging resistor $R_L$ up to the voltage $V_{GH}$.

If the MOS field-effect transistor $T_o$ is to be switched off, it is necessary that the other input $E_E$ receives a control charge signal $S_E$ which closes the electronic switches N1, N2 in the two current paths 14, 16 of the discharge circuit 12 so that the discharge circuit 12 is applied to the gate electrode G of the MOS field-effect transistor $T_o$, causing the discharge of the gate-source capacitance $C_{GS}$ to be initiated. In this situation the electronic switch N6 of the charging circuit 20 is again open, this having resulted from reducing the control charging signal $S_L$ at the input $E_L$.

On commencement of the discharge action and with the electronic switch N1 closed, the voltage divider R1–R3 receives a gate-source voltage $U_{GS}$ of the MOS field-effect transistor $T_o$ which is substantially still equal to the voltage VGH (viz. FIG. 4A).

As soon as the electronic switch N1 is closed at time $t_o$ a control voltage $U_{St}$ materializes at the gate electrode $N3_G$ of the switching transistor N3 depending on the gate-source voltage $U_{GS}$ of the MOS field-effect transistor $T_o$ and on the dimensioning of the voltage divider R1–R3. This voltage divider R1–R3 is now dimensioned such that the switching transistor N3 is ON with closure of the electronic switch N1 so that both the electronic switch N5 bypassing the resistor R3 and the electronic switch N4 in the current path 12 are open.

Application of the resistor R3 resulting from the electronic switch N5 being opened is equivalent to a positive feedback of the output signal of the switching transistor N3 to its input so that this switching transistor N3 is switched on relatively quickly (hard ON).

During this initial switch-off phase the gate-source capacitance $C_{GS}$ of the MOS field-effect transistor $T_o$ is thus discharged via the series arrangement of the resistors R1, R2 and R3 of the voltage divider R1–R3. The sum of these resistors R1, R2 and R3 is defined so that a relatively high internal impedance results for the current path 14 of the discharge circuit 12 to make sure that the gate-source capacitance CGS is discharged firstly in accordance with a desired, in general relatively large time constant t. During this initial discharge phase the discharge circuit 12 accordingly has a relatively high internal impedance $Z_1$ which is determined exclusively by the current path 14 (viz. FIG. 4B).

As soon as the gate-source voltage $U_{GS}$ of the MOS field-effect transistor $T_o$ drops below the assignable clamp value $U_{GSB}$ (viz. FIG. 4A) the control voltage $U_{St}$ dropped across the resistors R2 and R3 for the switching transistor N3 has fallen to such an extent that the latter is OFF. At time $t_1$ (viz. FIGS. 4A and 4B) the two electronic switches N4 and N5 are closed via the OFF action of transistor N3, so that the resistor R2 in the current path 14 is bypassed, and the gate-source capacitance $C_{GS}$ of the MOS field-effect transistor $T_o$ is practically shorted via the two closed electronic switches N2, N4 of the current path 16 of the discharge circuit 12. As of time $t_1$ the remaining discharge of the gate-source capacitance $C_{GS}$ is thus very quick as illustrated in FIG. 4A by the steep slope in the time profile of the gate-source voltage $U_{GS}$.

As is evident from FIG. 4B the internal impedance $Z_1$ of the discharge circuit 12 collapses at time $t_1$ from the relatively high value $Z_1$ to the relatively low value $Z_1$ in the region of zero. While the relative high impedance $Z_1$ during the initial discharge phase is dictated by the current path 14 comprising the voltage divider R1–R3, the relatively low internal impedance $Z_1$ results from the sum of the two negligably small output impedances of the closed, i.e. ON electronic switches N2, N4 of the current path16.

By bypassing the resistor R3 by means of the closed electronic switch N5 the return ON point of the switching transistor N3 with respect to the OFF point is elevated, achieving an hysteresis. Accordingly, for a repeat ON of the switching transistor N3 a higher gate-source voltage $U_{GS}$ is necessary than is the case during switch-off.

Since the gate electrode G of the MOS field-effect transistor $T_o$ in the OFF condition is loaded practically merely by the relatively low internal impedance $Z_1$ as determined by current path 16, it is impossible for any noise signals $I_S$ coupled into the circuit via the reverse capacitance $C_r$ to increase the gate voltage to such an extent that this could result in an unwanted repeat ON of the transistor $T_o$.

We claim:

1. A field effect transistor (FET) gate control circuit comprising:
    a switchable discharge circuit connected between a source and a gate of said FET wherein said discharge circuit comprises:
        a first current path and a second current path connected in parallel and coupled to said gate of said FET wherein said first current path has a substantially larger impedance than said second current path and during turn-off of said FET said first current path is selected and said second current path is deselected until the gate-source voltage of said FET drops below a predetermined value and said second current path is selected via a switching transistor when the gate-source voltage of said FET drops below said predetermined value such that the gate-source voltage of said FET is discharged essential only via said first current path prior to reaching said predetermined value and via said second current path after reaching said predetermined value.

2. The circuit of claim 1, wherein said first current path and said second current path are connected to said FET via at least one electronic switch, said electronic switch being controlled by a discharge signal.

3. The circuit of claim 2, wherein said at least one electronic switch comprises a first electronic switch connected in series to said first current path and a second electronic switch connected in series to said second current path.

4. The circuit of claim 1, wherein said first current path comprises a voltage divider.

5. The circuit of claim 1, wherein said second current path comprises a third electronic switch.

6. The circuit of claim 5, wherein said third electronic switch is controlled by said switching transistor.

7. The circuit of claim 1, wherein said switching transistor is connected to a constant current source.

8. The circuit of claim 1, wherein said switching transistor is controlled by a control voltage.

9. The circuit of claim 8, further comprising a fourth electronic switch, controlled by said switching transistor, through which a portion of said first current path can be bypassed to reduce said control voltage after said gate-source voltage of said FET drops below said pre-determined value.

10. The circuit of claim 1, further comprising a charging circuit connected to said FET to charge a capacitance between said gate and said source of said FET.

11. The circuit of claim 10, wherein said charging circuit comprises a charging resistor.

12. The circuit of claim 10, wherein said charging circuit is controlled by a fifth electronic switch which is controlled by a control charge signal.

13. The circuit of claim 12, wherein said fifth electronic switch is connected in series with said charging circuit.

* * * * *

UNITED STATES PATENT AND TRADEMARK OFFICE
CERTIFICATE OF CORRECTION

PATENT NO. : 5,548,240
DATED : August 20, 1996
INVENTOR(S) : Erich Bayer

It is certified that error appears in the above-indentified patent and that said Letters Patent is hereby corrected as shown below:

TITLE PAGE:

Assignee should read:

Texas Instruments Deutschland GmbH
Haggertystrasse 1
Freising, Germany 8050

Signed and Sealed this

Fifteenth Day of April, 1997

*Attest:*

BRUCE LEHMAN

*Attesting Officer*     *Commissioner of Patents and Trademarks*